US012733271B2

(12) United States Patent
Tekleab et al.

(10) Patent No.: US 12,733,271 B2
(45) Date of Patent: Sep. 8, 2026

(54) ANTI-BLOOMING CONTROL IN OVERFLOW IMAGE SENSOR PIXEL

(71) Applicant: SEMICONDUCTOR COMPONENTS INDUSTRIES, LLC, Phoenix, AZ (US)

(72) Inventors: Daniel Tekleab, San Jose, CA (US); Bartosz Piotr Banachowicz, San Jose, CA (US); Manuel H. Innocent, Wezemaal (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 668 days.

(21) Appl. No.: 18/148,558

(22) Filed: Dec. 30, 2022

(65) Prior Publication Data

US 2023/0282677 A1 Sep. 7, 2023

Related U.S. Application Data

(60) Provisional application No. 63/268,736, filed on Mar. 1, 2022.

(51) Int. Cl.
*H10F 39/18* (2025.01)
*H04N 25/621* (2023.01)
*H10F 39/00* (2025.01)

(52) U.S. Cl.
CPC ....... *H10F 39/1865* (2025.01); *H04N 25/622* (2023.01); *H10F 39/014* (2025.01)

(58) Field of Classification Search
CPC .......................... H10F 39/1865; H04N 25/622
See application file for complete search history.

(56) References Cited

U.S. PATENT DOCUMENTS 4,975,777 A 12/1990 Lee et al.
9,159,753 B2 10/2015 Hynecek
9,369,648 B2 * 6/2016 Hynecek ........... H10F 39/80373
9,654,713 B2 * 5/2017 Hynecek ........... H10F 39/80373
10,002,895 B2 6/2018 Tekleab et al.
12,407,954 B2 * 9/2025 Velichko ................ H04N 25/77

(Continued)

FOREIGN PATENT DOCUMENTS

TW 201810631 A * 3/2018

OTHER PUBLICATIONS

German Search Report completed May 26, 2023 for German Application No. 102023102512.0, 7 pages.

(Continued)

*Primary Examiner* — Mounir S Amer
*Assistant Examiner* — Alexander Belousov
(74) *Attorney, Agent, or Firm* — Dickinson Wright PLLC

(57) ABSTRACT

Anti-blooming control in overflow image sensor pixel. At least one example is an image sensor pixel comprising: a photodetector positioned in a semiconductor substrate; a gate oxide layer positioned on the semiconductor substrate; a floating diffusion; a transfer gate positioned on the gate oxide layer; a first anti-blooming implant positioned in the semiconductor substrate, wherein the first anti-blooming implant is coupled to the photodetector and the floating diffusion; and a second anti-blooming implant positioned in the semiconductor substrate, wherein the second anti-blooming implant is coupled to the photodetector and a voltage source contact.

15 Claims, 7 Drawing Sheets

(56) References Cited

U.S. PATENT DOCUMENTS

| | | | | |
|---|---|---|---|---|
| 2015/0171122 | A1* | 6/2015 | Hynecek | H10F 39/80373 257/230 |
| 2020/0411585 | A1* | 12/2020 | Huang | H10F 39/805 |
| 2023/0282677 | A1* | 9/2023 | Tekleab | H10F 39/1865 |

OTHER PUBLICATIONS

Tadmor, Erez, et al., "A High QE, Fast Shuttered CMOS Image Sensor with a Vertical Overflow Drain Shutter Mechanism", High speed, Gated and Time-Of-Flight Imaging, Jun. 9, 2015, 4 pages.

* cited by examiner

ANTI-BLOOMING CONTROL IN OVERFLOW IMAGE SENSOR PIXEL

CROSS-REFERENCE TO RELATED APPLICATIONS

This application claims priority to and the benefit of U.S. Provisional Application Ser. No. 63/268,736, filed Mar. 1, 2022, titled "METHOD TO IMPROVE BLOOMING IN OVERFLOW MODE PIXEL," the entire disclosure of which is hereby incorporated by reference for all purposes.

BACKGROUND

Image sensors are used in electronic devices such as cellular telephones, cameras, and computers to capture images. In particular, an electronic device is provided with an array of image sensor pixels arranged in a grid pattern. Each image sensor pixel receives incident photons, such as light, and converts the photons into electrical signals. Column circuitry is coupled to each column for reading out sensor signals from each image sensor pixel.

In certain applications, a photodiode of an image sensor pixel may become filled with charge in the form of electrons, and excess generated electrons may "spill" or migrate into a photodiode of a neighboring image sensor pixel. These excess electrons, which may be referred to as blooming charge, may result when the image sensor is exposed to bright light. In these scenarios, blooming charge can create various undesirable artifacts in a resulting image.

SUMMARY

Blooming performance is key pixel metric, especially in an overflow mode pixels. In an overflow pixel, blooming charges can be directed to flow through a transfer gate using an anti-blooming implant. Such anti-blooming implants help lower the potential under the transfer gate, which eases blooming concerns. However, under extreme light condition such anti-blooming implants are not enough to handle the overflow blooming.

A dedicated anti-blooming gate can be used to handle overflow blooming. However, adding an anti-blooming gate adds significant area overhead and can cause photodetector dark signal non-uniformity (DSNU) degradation. Thus, the present disclosure provides methods, imaging systems, and image sensor pixels that, among other things, handle overflow blooming using an anti-blooming implant that lowers a potential barrier between a photodetector and a voltage source contact.

One example is an image sensor pixel comprising: a photodetector positioned in a semiconductor substrate that generates a charge in response to incident light; a gate oxide layer positioned on the semiconductor substrate; a floating diffusion; a transfer transistor having a transfer gate positioned on the gate oxide layer, wherein the transfer transistor transfers the charge generated by the photodetector to the floating diffusion; a first anti-blooming implant positioned in the semiconductor substrate, wherein the first anti-blooming implant is coupled to the photodetector and the floating diffusion to transfer a blooming charge generated by the photodetector to the floating diffusion, and wherein the first anti-blooming implant at least partially overlaps the transfer gate; and a second anti-blooming implant positioned in the semiconductor substrate, wherein the second anti-blooming implant is coupled to the photodetector and a voltage source contact to transfer the blooming charge generated by the photodetector to the voltage source contact.

In the example image sensor pixel, the second anti-blooming implant may be further configured such that a potential barrier on the second anti-blooming implant is greater than a potential barrier on the first anti-blooming implant. The first anti-blooming implant may be formed in the semiconductor substrate with a first mask, and wherein the second anti-blooming implant may be formed in the semiconductor substrate with a second mask. The doping level of the second anti-blooming implant may be configured to set the potential barrier on the second anti-blooming implant greater than the potential barrier on the first anti-blooming implant.

In the example image sensor pixel, the first anti-blooming implant and the second anti-blooming implant are formed with a single mask, and the second anti-blooming implant may be configured to be narrower than the first anti-blooming implant such that the potential barrier on the second anti-blooming implant is greater than the potential barrier on the first anti-blooming implant.

The example image sensor pixel may further comprise a pinning implant positioned between the gate oxide layer and the photodetector, wherein a bias voltage applied at the voltage source contact is greater than a pinning voltage of the photodetector. The voltage source contact may be coupled to an independent control line or an independent node.

Another example is an imaging system comprising: a lens system; an imaging controller; and an image sensor in operational relationship with the lens system and electrically coupled to the imaging controller, wherein the image sensor includes an array of image sensor pixels. Each image sensor pixel may include: a photodetector that generates a charge in response to incident light, a gate oxide layer, a floating diffusion, a transfer transistor that transfers the charge generated by the photodetector to the floating diffusion, a first anti-blooming implant coupled to the photodetector and the floating diffusion to transfer a blooming charge generated by the photodetector to the floating diffusion, and a second anti-blooming implant coupled to the photodetector and a voltage source contact to transfer the blooming charge generated by the photodetector to the voltage source contact.

In the example imaging system, the second anti-blooming implant may be further configured such that a potential barrier on the second anti-blooming implant is greater than a potential barrier on the first anti-blooming implant. The first anti-blooming implant may be formed with a first mask, and wherein the second anti-blooming implant may be formed with a second mask. The second anti-blooming implant may be narrower than the first anti-blooming implant such that the potential barrier on the second anti-blooming implant is greater than the potential barrier on the first anti-blooming implant. The doping level of the second anti-blooming implant may be configured to set the potential barrier on the second anti-blooming implant greater than the potential barrier on the first anti-blooming implant.

The example imaging system may further comprise a pinning implant, wherein a bias voltage applied at the voltage source contact may be greater than a pinning voltage of the photodetector. The voltage source contact may couple to a positive power supply terminal or an independent control line.

The imaging system may be at least one selected from the group consisting of an automobile, a vehicle, a camera, a cellular telephone, a tablet computing, a webcam, a video camera, a video surveillance system, and a video gaming system.

Yet another example is a method for constructing an image sensor pixel, the method comprising: forming a photodetector in a semiconductor substrate, wherein the photodetector generates a charge in response to incident light; forming a gate oxide layer on the semiconductor substrate; forming a floating diffusion; forming a transfer gate on the gate oxide layer; forming a first anti-blooming implant in the semiconductor substrate, wherein the first anti-blooming implant is coupled to the photodetector and the floating diffusion to transfer a blooming charge generated by the photodetector to the floating diffusion, and wherein the first anti-blooming implant at least partially overlaps the transfer gate; and forming a second anti-blooming implant in the semiconductor substrate, wherein the second anti-blooming implant is coupled to the photodetector and a voltage source contact to transfer the blooming charge generated by the photodetector to the voltage source contact.

In the example method, forming the second anti-blooming implant in the semiconductor substrate may further include configuring the second anti-blooming implant such that a potential barrier on the second anti-blooming implant is greater than a potential barrier on the first anti-blooming implant. The first anti-blooming implant may be formed in the semiconductor substrate with a first mask, and wherein the second anti-blooming implant may be formed in the semiconductor substrate with a second mask.

The example method may further comprise: forming a pinning implant between the gate oxide layer and the photodetector; and applying a bias voltage at the voltage source contact, wherein the bias voltage is greater than a pinning voltage of the photodetector. The example method may further comprise coupling the voltage source contact to an independent control line or an independent node.

BRIEF DESCRIPTION OF THE DRAWINGS

For a detailed description of example implementations, reference will now be made to the accompanying drawings in which.

DEFINITIONS

Figure 1A:
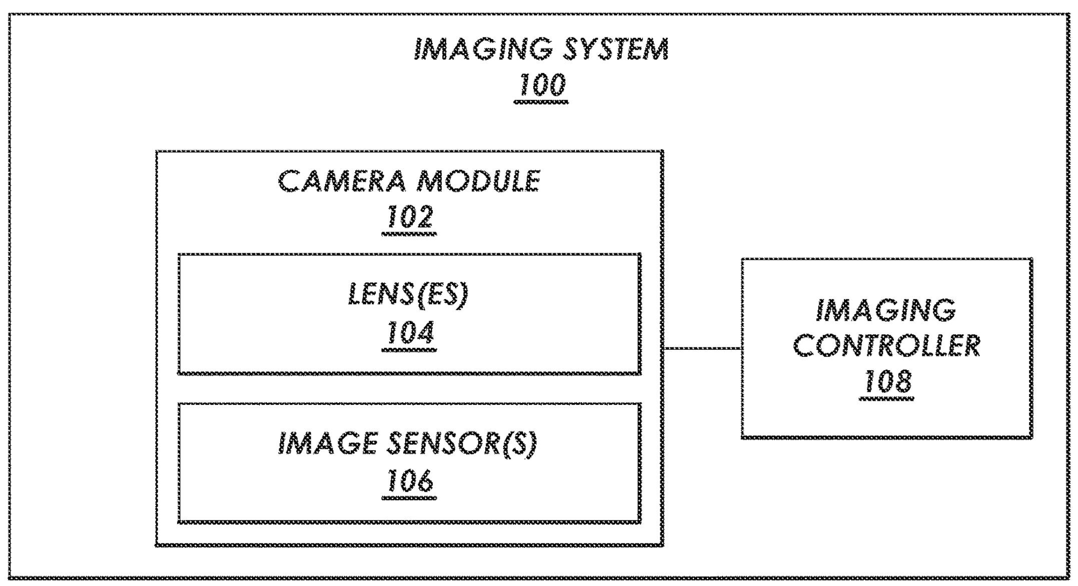
FIG. 1A is a block diagram of an example of an imaging system in accordance with some implementations.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

In relation to electrical devices, whether stand alone or as part of an integrated circuit, the terms "input" and "output" refer to electrical connections to the electrical devices, and shall not be read as verbs requiring action. For example, a differential amplifier, such as an operational amplifier, may have a first differential input and a second differential input, and these "inputs" define electrical connections to the operational amplifier, and shall not be read to require inputting signals to the operational amplifier.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Controller" shall mean, alone or in combination, individual circuit components, an application specific integrated circuit (ASIC), a microcontroller with controlling software, a reduced-instruction-set computer (RISC), a digital signal processor (DSP), a processor with controlling software, a programmable logic device (PLD), a field programmable gate array (FPGA), or a programmable system-on-a-chip (PSOC) configured to read inputs and drive outputs responsive to the inputs.

DETAILED DESCRIPTION

The following discussion is directed to various implementations of the invention. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the present disclosure, including the claims, is limited to that implementation.

Various examples are directed to image sensor pixels with anti-blooming paths for electrons, the anti-blooming paths created by implants. More particularly, various examples are directed to imaging systems and related anti-blooming implants that provide anti-blooming paths for high light intensity. The specification now turns to an example system to orient the reader.

FIG. 1A shows an example of an imaging system 100. In particular, the imaging system 100 may be a portable electronic device such as a camera, a cellular telephone, a tablet computer, a webcam, a video camera, a video surveillance system, or a video gaming system with imaging capabilities. In other cases, the imaging system 100 may be an automotive imaging system. The imaging system 100 illustrated in FIG. 1A includes a camera module 102 that may be used to convert incoming light into digital image data. The camera module 102 may include one or more lenses 104 and one or more corresponding image sensors 106. The lenses 104 may include fixed and/or adjustable lenses. During image capture operations, light from a scene may be focused onto the image sensor 106 by the lenses 104. The image sensor 106 may comprise circuitry for converting analog pixel data into corresponding digital image data to be provided to the imaging controller 108. If desired, the camera module 102 may be provided with an array of lenses 104 and an array of corresponding image sensors 106.

The imaging controller 108 may include one or more integrated circuits. The imaging circuits may include image processing circuits, microprocessors, and storage devices, such as random-access memory, and non-volatile memory. The imaging controller 108 may be implemented using components that are separate from the camera module 102 and/or that form part of the camera module 102, for example, circuits that form part of the image sensor 106. Digital image data captured by the camera module 102 may be processed and stored using the imaging controller 108. Processed image data may, if desired, be provided to external equipment, such as computer, external display, or other device, using wired and/or wireless communications paths coupled to the imaging controller 108.

Figure 1B:
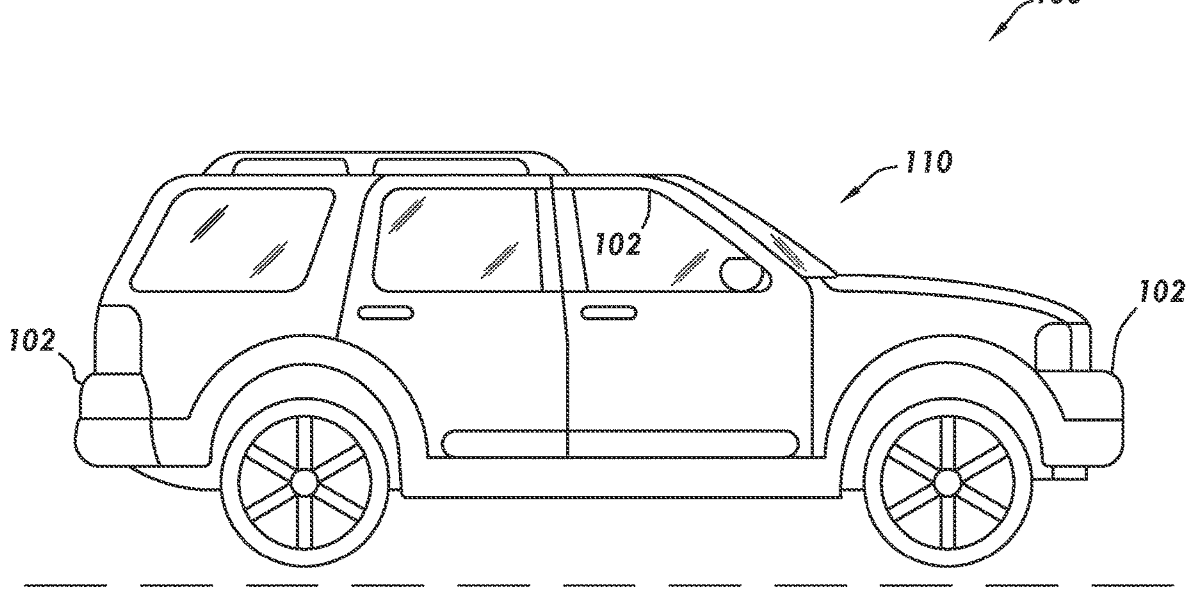
FIG. 1B is a diagram of an example of an imaging system incorporated in a vehicle in accordance with some implementations.

FIG. 1B shows another example of the imaging system 100. The imaging system 100 illustrated in FIG. 1B comprises an automobile or vehicle 110. The vehicle 110 is illustratively shown as a passenger vehicle, but the imaging system 100 may be other types of vehicles, including commercial vehicles, on-road vehicles, and off-road vehicles. Commercial vehicles may include busses and tractor-trailer vehicles. Off-road vehicles may include tractors and crop harvesting equipment. In the example of FIG. 1B, the vehicle 110 includes a forward-looking cameral module 102 arranged to capture images of scenes in front of the vehicle 110. Such forward-looking camera module 102 can be used for any suitable purpose, such as lane-keeping assist, collision warning systems, distance-pacing cruise-control systems, autonomous driving systems, and proximity detection. The vehicle 110 further comprises a backward-looking camera module 102 arranged to capture images of scenes behind the vehicle 110. Such backward-looking camera module 102 can be used for any suitable purpose, such as collision warning systems, reverse direction video, autonomous driving systems, proximity detection, monitoring position of overtaking vehicles, and backing up. The vehicle 110 further comprises a side-looking camera module 102 arranged to capture images of scenes beside the vehicle 110. Such side-looking camera module can be used for any suitable purpose, such as blind-spot monitoring, collision warning systems, autonomous driving systems, monitoring position of overtaking vehicles, lane-change detection, and proximity detection. In situation in which the imaging system 100 is a vehicle, the imaging controller 108 may be a controller of the vehicle 110. The discussion now turns in greater detail to the image sensor 106 of the camera module 102.

Figure 2:
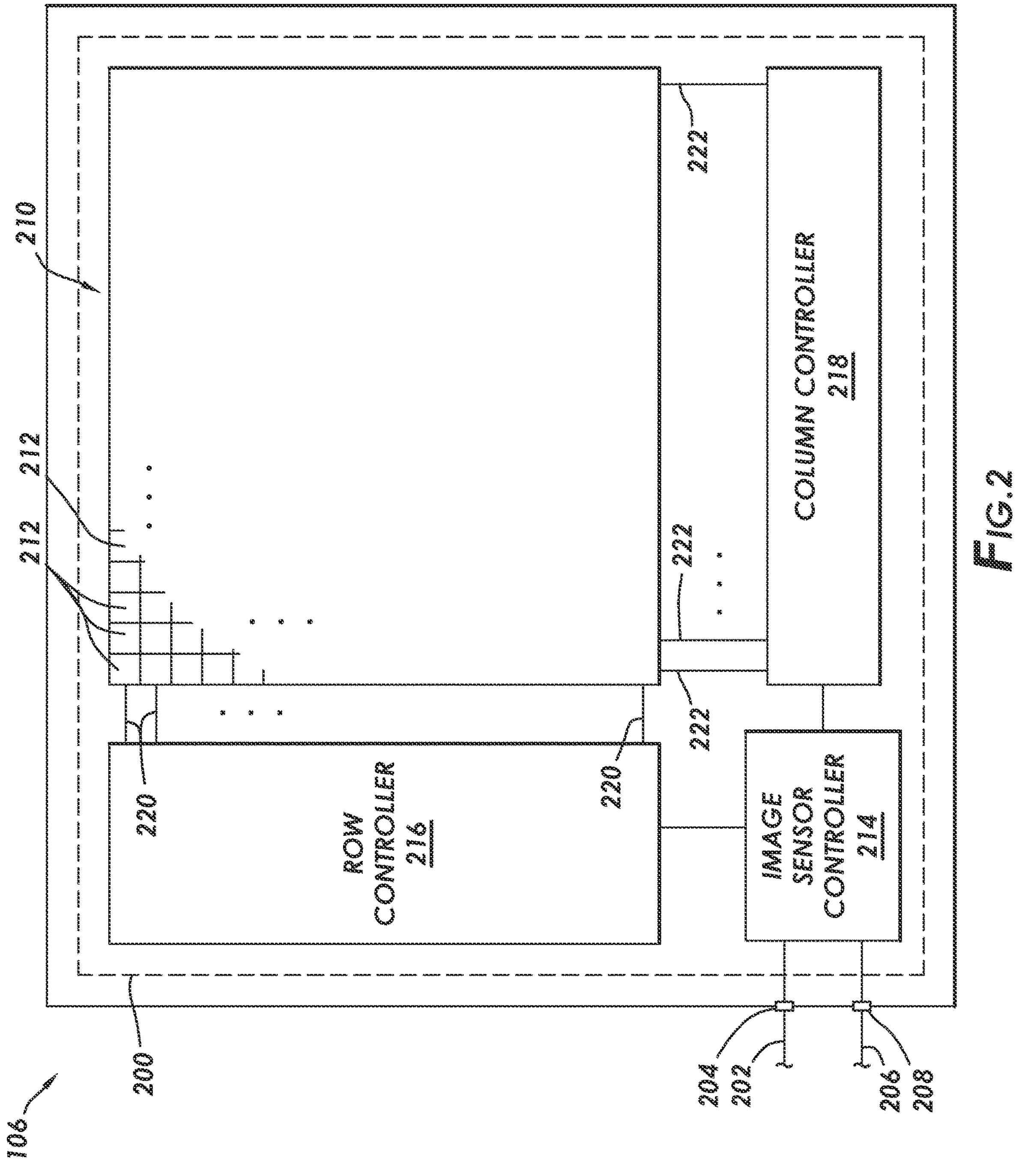
FIG. 2 is a partial schematic and a partial block diagram of an example of an image sensor in accordance with some implementations.

FIG. 2 shows an example of the image sensor 106. In particular, FIG. 2 shows that the image sensor 106 may comprise a substrate 200 of semiconductor material (e.g., silicon) encapsulated within packaging to create a packaged semiconductor device or packaged semiconductor product. Bond pads or other connection points of the substrate 200 couple to terminals of the image sensor 106, such as the serial communication channel 202 coupled to terminal(s) 204, and capture input 206 coupled to terminal 208. Additional terminals will be present, such as ground, common, or power, but the additional terminals are omitted so as not to unduly complicate the figure. While a single instance of the substrate 200 is shown, in other cases multiple substrates may be combined to form the image sensor 106 to form a multi-chip module.

The image sensor 106 comprises a pixel array 210 containing a plurality of image sensor pixels 212 arranged in rows and columns. Pixel array 210, being one example of an "array of pixels", may comprise, for example, hundreds or thousands of rows and columns of image sensor pixels 212. Control and readout of the pixel array 210 may be implemented by an image sensor controller 214 coupled to a row controller 216 and a column controller 218. The row controller 216 may receive row addresses from image sensor controller 214 and supply corresponding row control signals to image sensor pixels 212, such as reset, row-select, charge transfer, dual conversion gain, and readout control signals. The row control signals may be communicated over one or more conductors, such as row control paths 220.

Column controller 218 may be coupled to the pixel array 210 by way of one or more conductors, such as column lines 222. Column controllers may sometimes be referred to as column control circuits, readout circuit, or column decoders. Column lines 222 may be used for reading out image signals from image sensor pixels 212 and for supplying bias currents and/or bias voltages to image sensor pixels 212. If desired, during pixel readout operations, a pixel row in the pixel array 210 may be selected using row controller 216 and image signals generated by image sensor pixels 212 in that pixel row can be read out along column lines 222. The column controller 218 may include sample-and-hold circuitry for sampling and temporarily storing image signals read out from pixel array 210, amplifier circuitry, analog-to-digital conversion (ADC) circuitry, bias circuitry, column memory, latch circuitry for selectively enabling or disabling the column circuitry, or other circuitry that is coupled to one or more columns of pixels in the pixel array 210 for operating the image sensor pixels 212 and for reading out image signals from the image sensor pixels 212. ADC circuitry in the column controller 218 may convert analog pixel values received from the pixel array 210 into corresponding digital image data. Column controller 218 may supply digital image data to the image sensor controller 214 and/or the imaging controller 108 (FIG. 1) over, for example, the serial communication channel 202.

Figure 3:
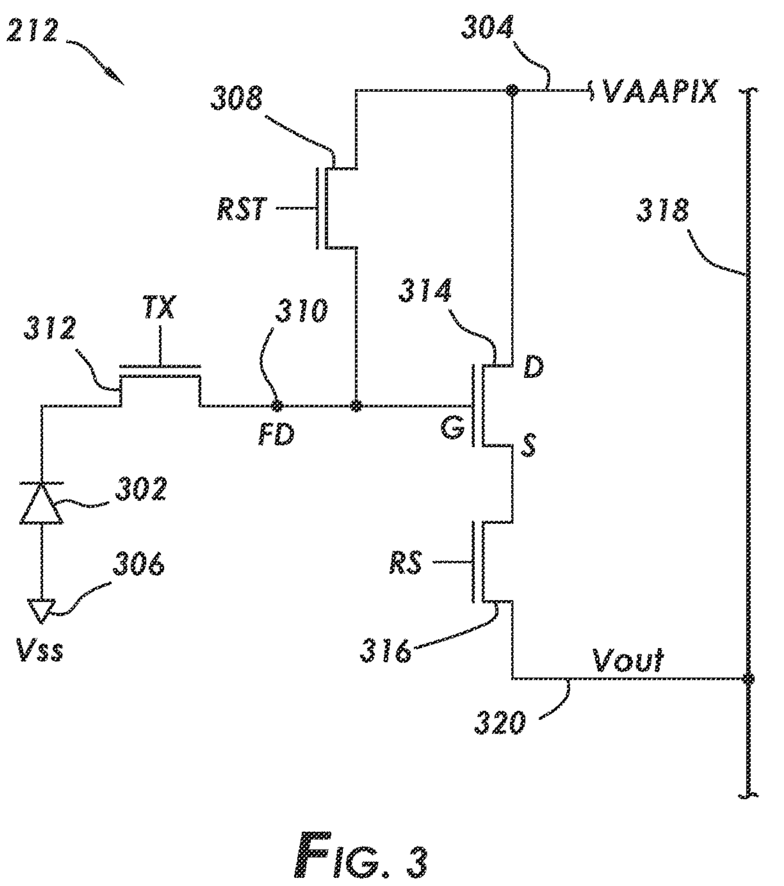
FIG. 3 is a schematic diagram of an example of an image sensor pixel in accordance with some implementations.

FIG. 3 shows an example of circuitry in the image sensor pixel 212. The image sensor pixel 212 may have fewer, additional, or different components in different configurations than the one illustrated in FIG. 3. In particular, FIG. 3 shows that the image sensor pixel 212 may comprise a photodetector 302 (e.g., a photodiode). A positive pixel power supply voltage, such as voltage VAAPIX, may be supplied at a positive power supply terminal 304. A ground power supply voltage (Vss) may be supplied at a ground terminal 306. Incoming light is gathered by the photodetector 302, in some cases after the light passes through a color filter structure (not shown). The photodetector 302 converts the light to electrical charge.

Before an image is acquired, a reset control signal RST may be asserted. The reset control signal RST makes conductive or turns on a reset transistor 308 and resets a charge storage node, such as a floating diffusion (FD) 310 to a voltage equal or close to voltage VAAPIX. The reset control signal RST may then be de-asserted to make non-conductive or turn off the reset transistor 308. After the reset process is complete, a transfer gate control signal TX may be asserted to turn on a transfer transistor 312. When the transfer transistor 312 is turned on, the charge generated by the photodetector 302 in response to incoming light is transferred to the floating diffusion 310 node. In particular, traditional current flow is actually hole flow, opposite of electron flow. Making the reset transistor 308 conductive makes floating diffusion 310 node positive by draining electrons from the floating diffusion 310 node. Making the transfer transistor 312 conductive enables electrons accumulated in the photodetector 302 to flow to floating diffusion 310 node.

The floating diffusion 310 node may be implemented using a region of doped semiconductor. For example, the region of doped semiconductor may be a doped silicon region formed in a silicon substrate by ion implantation, impurity diffusion, or other doping techniques. The doped semiconductor region, such as the floating diffusion 310 node, may exhibit a capacitance that is used to store the charge transferred from the photodetector 302. The signal associated with the stored charge on the floating diffusion 310 is buffered by a source-follower transistor 314. A row select transistor 316 connects the source-follower transistor 314 to a column output line 318.

When it is desired to read out the value of the stored charge, a control signal RS is asserted. The read-out value may be, for example, the value of the stored charge that is represented by the signal at the source terminal S of the source-follower transistor 314. When the control signal RS is asserted, the row select transistor 316 turns on and a signal Vout that is representative of the magnitude of the charge on the floating diffusion 310 node is produced on an output path 320. When the control signal RS is asserted, the column output line 318 can be used to route the signal Vout from the image sensor pixel 212 to readout circuitry, such as the column controller 218 in FIG. 2.

Figure 4:
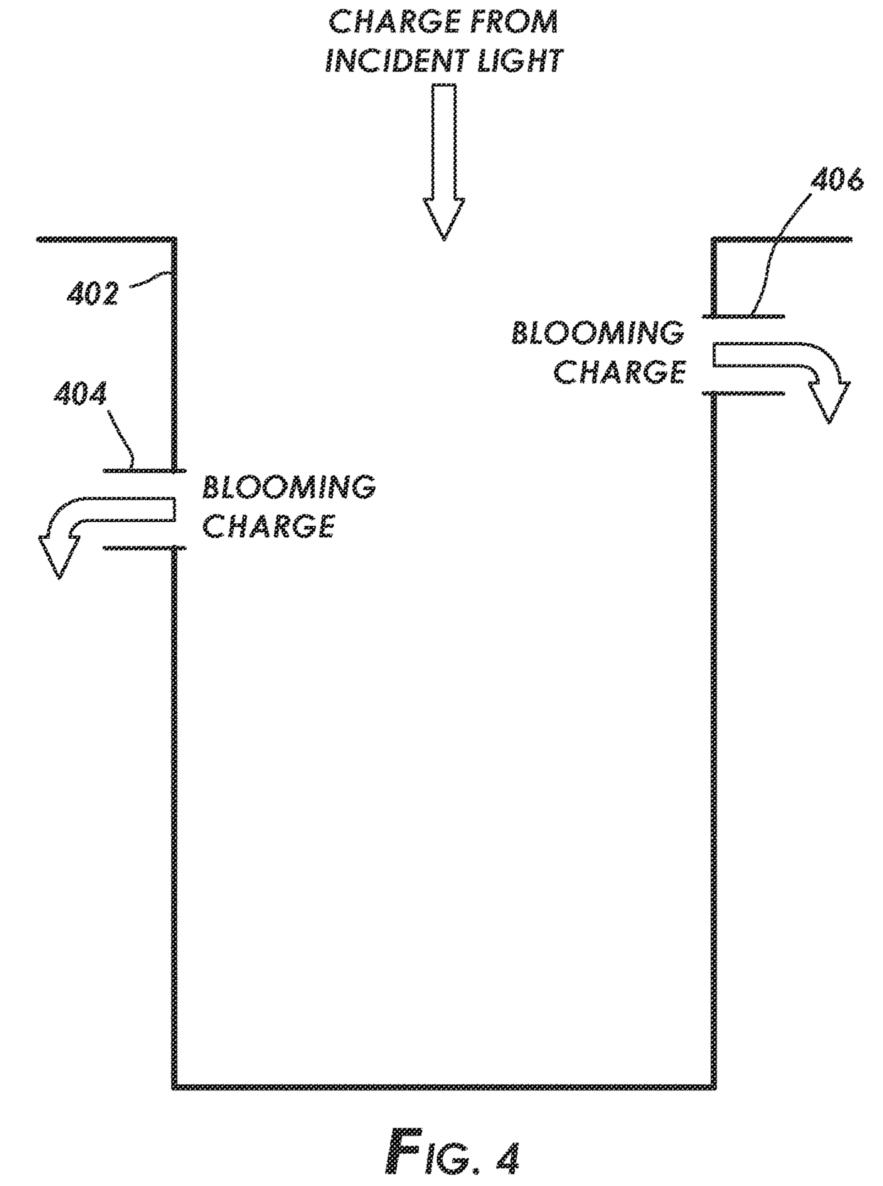
FIG. 4 is a diagram of a bucket representing a charge capacity of a photodetector in accordance with some implementations.

When the photodetector 302 is exposed to incident light, charge (electrons) begins to accumulate in the photodiode well. In some circumstances, more charge may be generated than what the photodetector 302 is capable of holding, such as when the image sensor pixel 212 is exposed to extremely bright light. In other words, the full well capacity of the photodetector 302 may be exceeded. For example, FIG. 4 shows a bucket 402 representing the full well capacity of the photodetector 302. As electrons are generated on or within the photodetector 302 from incident light, the bucket 402 fills up with electrons. If the bucket 402 gets too full, the electrons may "spill out" of the top and flow into adjacent photodiodes. This overflow of electrons, sometimes referred to herein as blooming or blooming charge, may cause undesirable image artifacts in a resulting image.

To prevent blooming, the image sensor pixel 212 includes anti-blooming features. For example, to prevent electrons from spilling out, the bucket 402 illustrated in FIG. 4 includes a first anti-blooming tap 404. The first anti-blooming tap 404 enables blooming charge to flow out of the bucket 402 and helps avoid blooming. Based on its design, the first anti-blooming tap 404 enables a set amount of blooming charge to flow out of the bucket 402. In some situations, the flow rate of the first anti-blooming tap 404 may be insufficient to prevent blooming. If the design of the first anti-blooming tap 404 is altered to raise its flow rate, conceptually the position of the first anti-blooming tap 404 on the bucket 402 is lowered. If the flow rate of the first anti-blooming tap 404 is too large, it can limit the amount of charge the bucket 402, representing the photodetector 302, can hold. Thus, there is a practical limit to how much blooming charge can flow through the first anti-blooming tap 404. To increase the amount of blooming charge that can be removed from the bucket 402 without unduly limiting its charge capacity, the bucket 402 includes a second anti-blooming tap 406. The anti-blooming tap 406 enables additional blooming charge to flow out of the bucket 402 without unduly limiting the total amount of charge the bucket 402 can hold. A similar methodology of multiple anti-blooming features may be implemented in the image sensor pixel 212, as will be described below.

The analogy of FIG. 4, while helpful in conceptually presenting the use of anti-blooming taps, is not fully instructive of the use of the anti-blooming taps in practice. In particular, FIG. 4 implies that electrons do not begin to flow through the anti-blooming tap 404 until a first amount of charge is accumulated in the bucket. Similarly, FIG. 4 implies that electrons do not begin to flow through the anti-blooming tap 406 until a second, higher amount of charge is accumulated in the bucket. The anti-blooming taps 404 and 406 are designed and constructed such that amount of blooming charge, or the rate of electron flow through the anti-blooming taps 404 and 406, is sufficiently low to ensure good image quality, but also sufficiently high to reduce the likelihood blooming.

Figure 5:
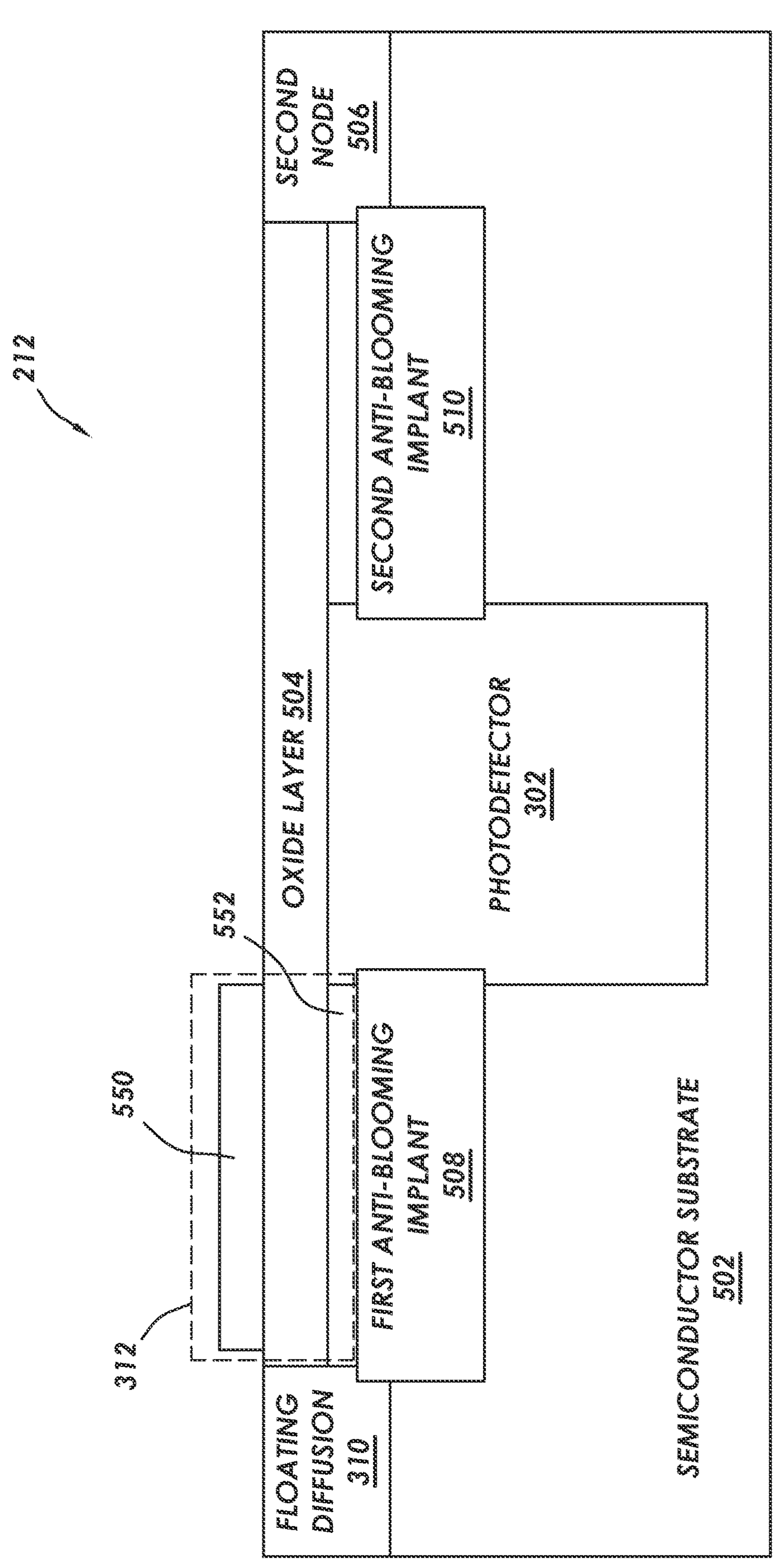
FIG. 5 is a partial cross-sectional view of an image sensor pixel in accordance with some implementations.

FIG. 5 is a simplified cross-sectional view of an example of the image sensor pixel 212. The image sensor pixel 212 illustrated in FIG. 5 includes the photodetector 302, the floating diffusion 310 node, the transfer transistor 312, a semiconductor substrate 502, an oxide layer 504, a second node 506 region, a first anti-blooming implant 508, and a second anti-blooming implant 510. Additional doped regions will be present, such as N-type and P-type doped regions, but the additional doped regions are omitted so as not to unduly complicate the figure. Further, the image sensor pixel 212 may have fewer, additional, or different components in different configurations than the one illustrated in FIG. 5. FIG. 5 is not necessarily to scale.

The transfer transistor 312 comprises a transfer gate 550, a portion of the oxide layer 504, and the channel region 552. The channel region 552 is coupled to the photodetector 302 on a first end, and the floating diffusion 310 node on the second end. When the transfer gate 550 is asserted, the potential barrier in the channel region 552 is lowered enabling charge to transfer to the floating diffusion 310 node.

At least partially beneath the transfer transistor 312 resides the first anti-blooming implant 508. In particular, the first anti-blooming implant 508 is formed in the semiconductor substrate 502 extending between the photodetector 302 and the floating diffusion 310 node. The first anti-blooming implant 508 may include an N-type doped region that provides a path for blooming charge to flow from the photodetector 302 to the floating diffusion 310 node. In FIG. 5, the first anti-blooming implant 508 resides beneath and spans a similar distance as the transfer transistor 312. In other cases, however, the first anti-blooming implant 508 may only partially overlap the transfer transistor 312.

The first anti-blooming implant 508 is designed and constructed to enable blooming charge to flow from the photodetector 302 to the floating diffusion 310 node. The rate of flow of blooming charge from the photodetector 302 to the floating diffusion 310 node is based on several parameters of the first anti-blooming implant 508. For example, the length, width, and depth of the first anti-blooming implant 508 plays a role in the rate of flow of blooming charge—with greater cross-sectional flow area and shorter lengths corresponding to more blooming charge flow, and smaller cross-sectional flow area and longer lengths corresponding to less blooming charge flow. Moreover, the doping of the first anti-blooming implant 508 plays a role—with heavy doping corresponding to more blooming charge flow, and lighter doping corresponding to less blooming charge flow. Any or all of the noted parameters may be selected at the design stage to achieve a predetermined blooming charge flow. Stated otherwise, the anti-blooming implant 508 lowers the potential barrier to the flow of electrons compared to the absence of the anti-blooming implant 508, and the magnitude of the potential barrier is determined at the design stage by the length, width, depth, and doping concentration of the anti-blooming implant 508.

The second anti-blooming implant 510 is formed in the semiconductor substrate 502 extending between the photodetector 302 and the second node region 506. The second anti-blooming implant 510 may include an N-type doped region that provides a path for blooming charge to flow from the photodetector 302 to the second node region 506. In some implementations, the second node 506 region is coupled to the positive power supply terminal 304, such as VAAPIX. The positive pixel power supply voltage is generally the highest voltage available in the image sensor pixel 212. Alternatively, the second node 506 region may be coupled to an independent control line or an independent node within the image sensor pixel 212. For example, the second node region 506 may be coupled to an independent control line that applies a fixed or adjustable bias voltage.

The second anti-blooming implant 510 is likewise designed and constructed to enable blooming charge to flow from the photodetector 302 to the second node 506 region. The rate of flow of blooming charge from the photodetector 302 to the second node 506 region is likewise based on parameters of the second anti-blooming implant 510. Greater cross-sectional flow area and shorter lengths corresponding to more blooming charge flow, and smaller cross-sectional flow area and longer lengths corresponding to less blooming charge flow. Likewise, heavy doping corresponding to more blooming charge flow, and lighter doping corresponding to less blooming charge flow. Any or all of the noted parameters may be selected at the design stage to achieve a predetermined blooming charge flow. Thus, much like the first anti-blooming path 508, the second anti-blooming path 510 lowers the potential barrier to the flow of electrons compared to the absence of the anti-blooming implant 510, and the magnitude of the potential barrier is determined at the design stage by the length, width, depth, and doping concentration of the anti-blooming implant 510. In one example case, the second anti-blooming implant 510 is configured such that a potential barrier presented by the second anti-blooming implant 510 is greater than the potential barrier presented by first anti-blooming implant 508. Stated otherwise, the rate of flow of blooming charge through the second anti-blooming path 510 is lower than the rate of flow of blooming charge through the first anti-blooming implant 508. In this manner, when the first anti-blooming implant 508 cannot handle excess charge, the second anti-blooming implant 510 enables the excess charge to flow to the second node 506 region.

In some implementations, the single mask is used to form both the first anti-blooming implant 508 and the second anti-blooming implant 510. In such cases, simultaneous implantation forms the anti-blooming implants 508 and 510. Simultaneous implantation may form anti-blooming implants that have the same doping concentration. When using a single mask to form both anti-blooming implants 508 and 510, the relative size, such as length and/or width may be selected to create the desired potential barriers.

In alternate implementations, separate masks are used to form the first anti-blooming implant 508 and the second anti-blooming implant 510. For example, a first mask may be used to form the first anti-blooming implant 508 in the semiconductor substrate 502 and a second mask may be used to form the second anti-blooming implant 510 in the semiconductor substrate 502. Using separate masks to form the anti-blooming implants 508 and 510 enables the respective implantation to take place at different times. Thus, when separate masks are used, the physical dimensions of the second anti-blooming implant 510 may be configured to cause a different potential barrier than the first anti-blooming implant 508. In addition, using separate masks may also allow for doping to be different from that of the first anti-blooming implant 508 based on a concentration and/or depth.

In some implementations, the image sensor pixel 212 includes two anti-blooming implants as illustrated in FIG. 5. In alternate implantations, the image sensor pixel 212 may include more than two anti-blooming implants. For example, the image sensor pixel 212 may include a voltage node contact (not shown) and a third anti-blooming implant (not shown) coupled to the photodetector 302 and the voltage node contact.

Figure 6:
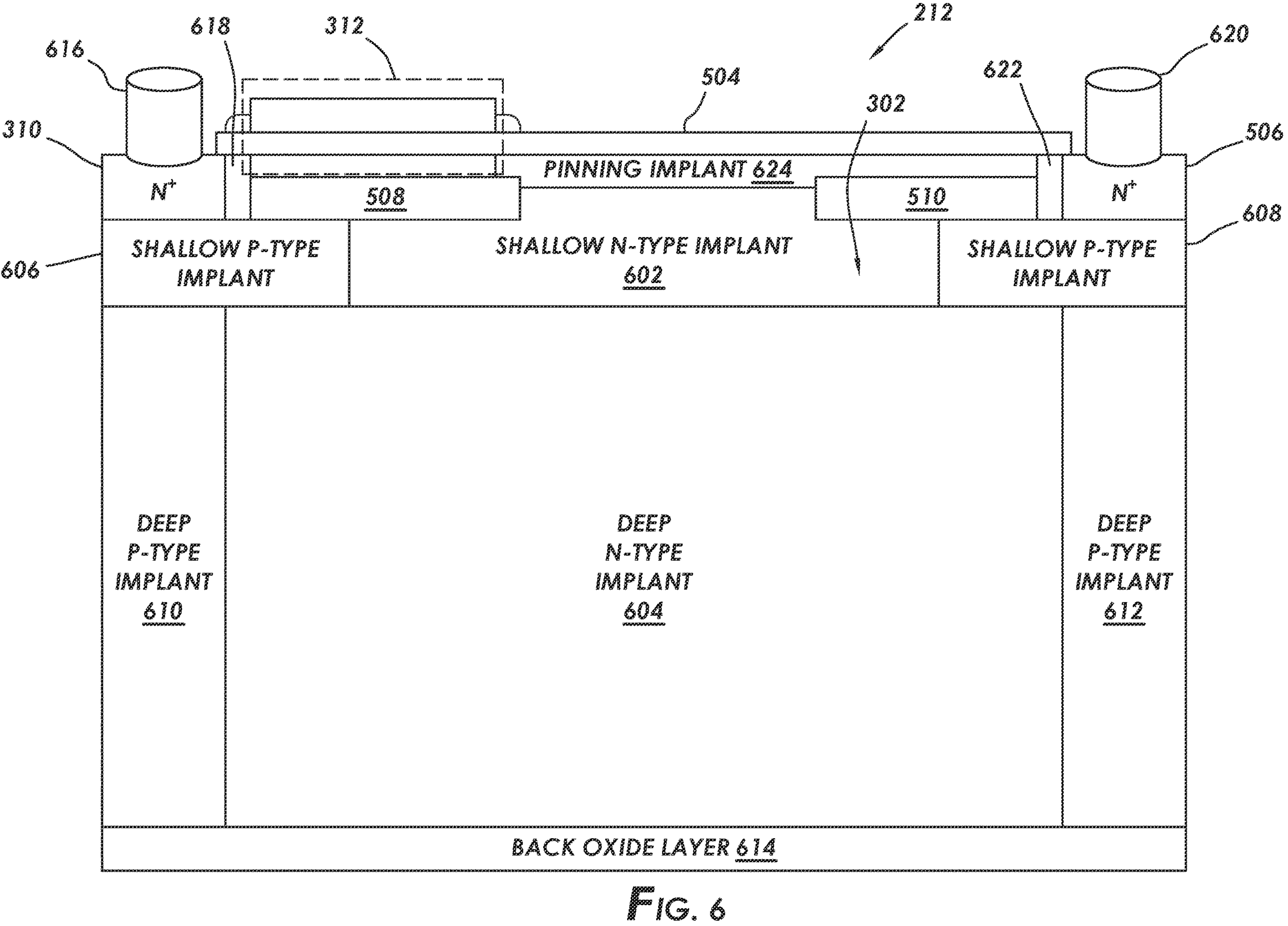
FIG. 6 is a partial cross-sectional view of an image sensor pixel including a photodetector formed with shallow and deep doped regions in accordance with some implementations.

FIG. 6 shows a partial cross-sectional view of an image sensor pixel in greater detail. The image sensor pixel 212 of FIG. 6 has many of the same elements as FIG. 5, but the duplicative elements will not be introduced again so as not to unduly lengthen the specification. FIG. 6 is not necessarily to scale. The example image sensor pixel 212 of FIG. 6 includes a photodetector formed with shallow and deep doped regions. For example, the photodetector 302 illustrated in FIG. 6 includes a shallow N-type implant 602, a deep N-Type implant 604, a pair of shallow P-type implants 606 and 608, and a pair of deep P-type implants 610 and 612. In some implementations, the depth of the shallow N-type implant 602 is approximately 0.1 microns. Further, in some implementations, the depths of the shallow P-type implants 606 and 608 are approximately 0.5 microns. The photodetector 302 illustrated in FIG. 6 is positioned next to a back oxide layer 614.

The first anti-blooming implant 508 illustrated in FIG. 6 provides a flow pathway from the shallow N-type implant 602 to the floating diffusion 310 node, such as an N+ region, by way of a first lightly doped N-type implant 618. FIG. 6 further shows a floating diffusion contact 616, such as metallization, in physical and electrical contact with the floating diffusion 310 node. Further, the second anti-blooming implant 510 illustrated in FIG. 6 provides a flow path from the shallow N-type implant 602 to the second node 506, such as an N+ region, by way of lightly doped N-type implant 622. FIG. 6 further shows a second contact 620, such as metallization, in physical and electrical contact with the second node region 506 node. The image sensor pixel 212 illustrated in FIG. 6 also includes a pinning implant 624, possibly a $P^+$ region positioned between the oxide layer 504 and the photodetector 302.

Figure 7:
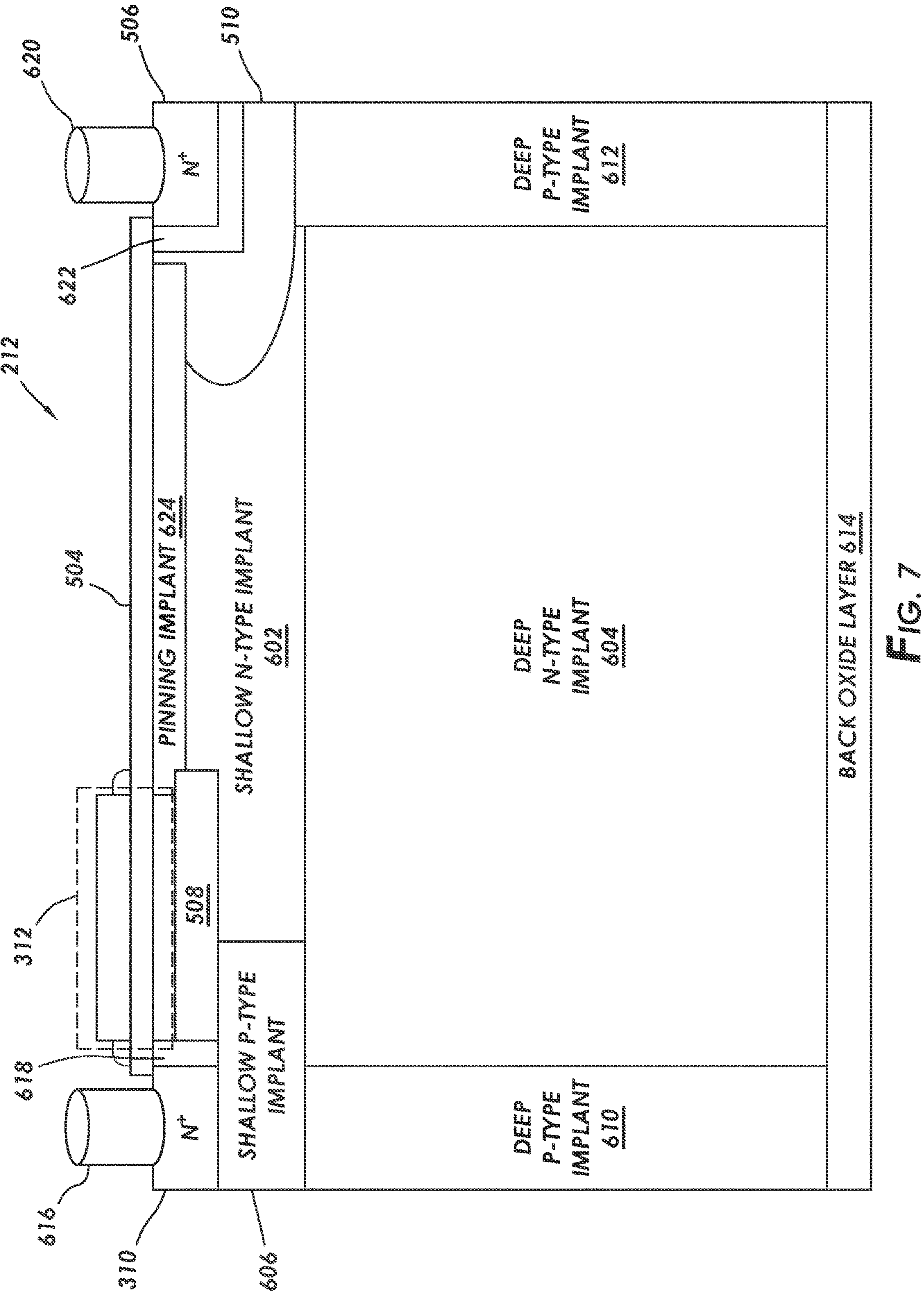
FIG. 7 is a partial cross-sectional view of an image sensor pixel including an anti-blooming implant formed by diffusing a portion of a lightly doped N-type implant in accordance with some implementations.

In the various examples discussed to this point, the second anti-blooming implant 510 is shown as a dedicated region extending between the photodetector 302, such as the shallow N-type implant 602, and the second node 506 region. However, in yet still further examples, the anti-blooming pathway may be created by extension and expansion of existing structures. FIG. 7 shows a partial cross-sectional view of another example image sensor pixel. The image sensor pixel 212 of FIG. 7 has many of the same elements as FIGS. 5 and 6, but the duplicative elements will not be introduced again so as not to unduly lengthen the specification. FIG. 7 is not necessarily to scale. In the example of FIG. 7, omitted is at least a portion of the shallow P-type implant just above the deep P-type implant 612, which may correspond to the shallow P-type implant 608 of FIG. 6. In the absence of the shallow P-type implant, the lightly doped N-type implant 622 diffuses outward from the second node 506 region. In these examples, the diffused lightly doped N-type implant 622 thus forms the second anti-blooming implant 510 for the image sensor pixel 212.

Figure 8:
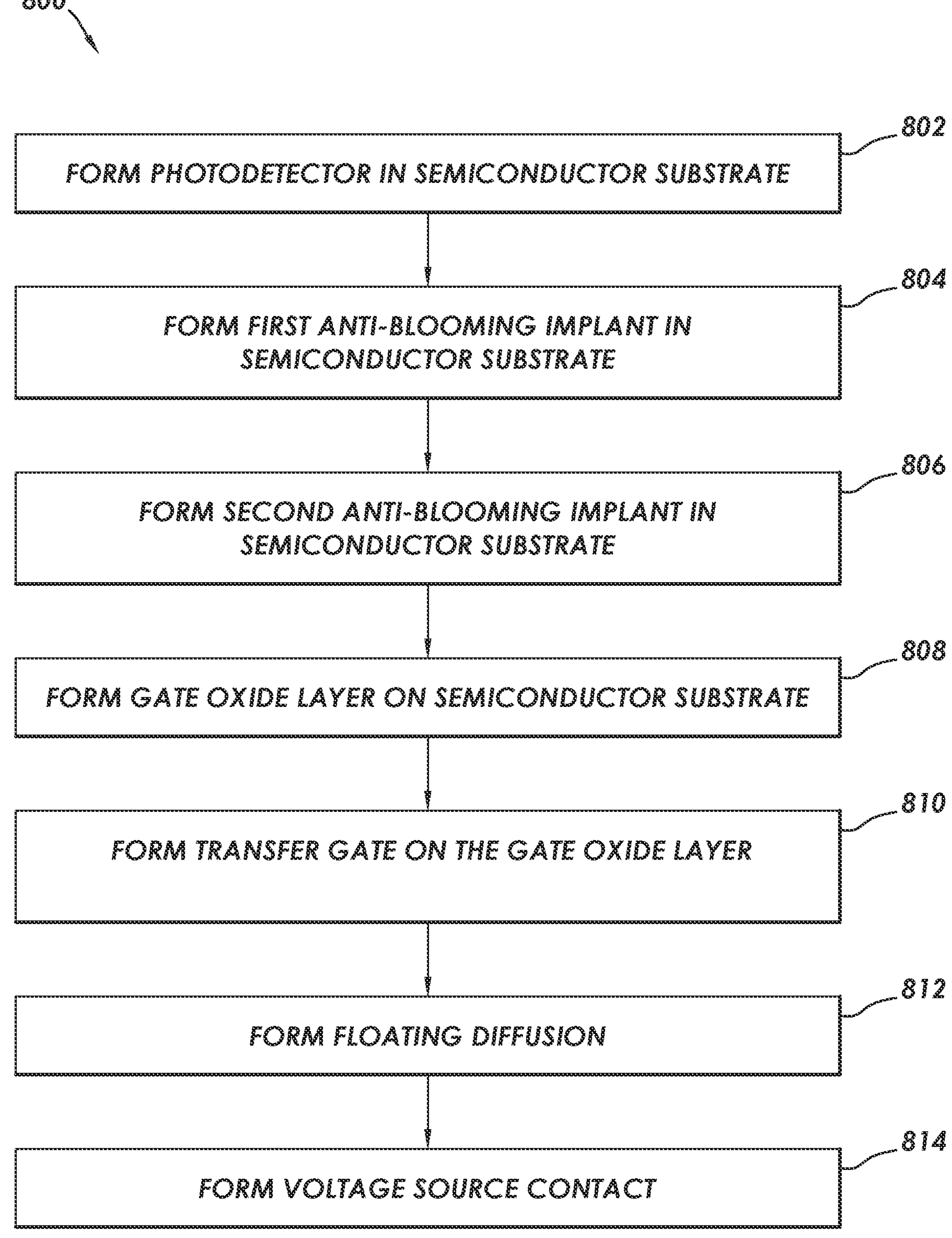
FIG. 8 is a flow diagram of an example of a method for constructing an image sensor pixel in accordance with some implementations.

FIG. 8 is a flow diagram of an example of a method for constructing an image sensor pixel in accordance with some implementations. At block 802, the photodetector 302 is formed in the semiconductor substrate 502. At block 804, the first anti-blooming implant 508 is formed in the semiconductor substrate 502. At block 806, the second anti-blooming implant 510 is formed in the semiconductor substrate 502. At block 808, the gate oxide layer 504 is formed on the semiconductor substrate 502. At block 810, the transfer gate 550 is formed on the gate oxide layer 504. At block 812, the floating diffusion 310 is formed. At block 814, the second node 506 region is formed.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various implementations of the present invention. Numerous variations and modifications will become apparent to those skilled in the art once the above disclosure is fully appreciated. For example, the illumination that results in charge transfer through the anti-blooming implants may be based on front-side illumination of the pixel array 212 or back-side illumination of the pixel array 212. It is intended that the following claims be interpreted to embrace all such variations and modifications.

What is claimed is:

1. An image sensor pixel comprising:

a photodetector positioned in a semiconductor substrate that generates a charge in response to incident light;

a gate oxide layer positioned on the semiconductor substrate;

a floating diffusion;

a transfer transistor having a transfer gate positioned on the gate oxide layer, wherein the transfer transistor transfers the charge generated by the photodetector to the floating diffusion;

a first anti-blooming implant positioned in the semiconductor substrate, wherein the first anti-blooming implant is directly coupled to the photodetector and extends between the photodetector and the floating diffusion to transfer a blooming charge generated by the photodetector to the floating diffusion; and a second anti-blooming implant positioned in the semiconductor substrate, wherein the second anti-blooming implant is directly coupled to the photodetector and extends between the photodetector and a voltage source contact to transfer the blooming charge generated by the photodetector to the voltage source contact.

2. The image sensor pixel of claim 1, wherein the second anti-blooming implant is further configured such that a potential barrier on the second anti-blooming implant is greater than a potential barrier on the first anti-blooming implant.

3. The image sensor pixel of claim 2, wherein the first anti-blooming implant is formed in the semiconductor substrate with a first mask, and wherein the second anti-blooming implant is formed in the semiconductor substrate with a second mask.

4. The image sensor pixel of claim 3, wherein a doping level of the second anti-blooming implant is configured to set the potential barrier on the second anti-blooming implant greater than the potential barrier on the first anti-blooming implant.

5. The image sensor pixel of claim 1, wherein the first anti-blooming implant and the second anti-blooming implant are formed with a single mask, and the second anti-blooming implant is configured to be narrower than the first anti-blooming implant such that a potential barrier on the second anti-blooming implant is greater than a potential barrier on the first anti-blooming implant.

6. The image sensor pixel of claim 1, further comprising a pinning implant positioned between the gate oxide layer and the photodetector, wherein a bias voltage applied at the voltage source contact is greater than a pinning voltage of the photodetector.

7. The image sensor pixel of claim 6, wherein the voltage source contact is coupled to an independent control line or an independent node.

8. An imaging system comprising:

a lens system;

an imaging controller; and an image sensor in operational relationship with the lens system and electrically coupled to the imaging controller, wherein the image sensor including an array of image sensor pixels, wherein each of the image sensor pixels including:

a photodetector that generates a charge in response to incident light, a gate oxide layer, a floating diffusion, a transfer transistor that transfers the charge generated by the photodetector to the floating diffusion, a first anti-blooming implant directly coupled to the photodetector and extending between the photodetector and the floating diffusion to transfer a blooming charge generated by the photodetector to the floating diffusion, and a second anti-blooming implant directly coupled to the photodetector and extending between the photodetector and a voltage source contact to transfer the blooming charge generated by the photodetector to the voltage source contact.

9. The imaging system of claim 8, wherein the second anti-blooming implant is further configured such that a potential barrier on the second anti-blooming implant is greater than a potential barrier on the first anti-blooming implant.

10. The imaging system of claim 9, wherein the first anti-blooming implant is formed with a first mask, and wherein the second anti-blooming implant is formed with a second mask.

11. The imaging system of claim 10, wherein the second anti-blooming implant is configured to be narrower than the first anti-blooming implant such that the potential barrier on the second anti-blooming implant is greater than the potential barrier on the first anti-blooming implant.

12. The imaging system of claim 10, wherein a doping level of the second anti-blooming implant is configured to set the potential barrier on the second anti-blooming implant greater than the potential barrier on the first anti-blooming implant.

13. The imaging system of claim 8, further comprising a pinning implant, wherein a bias voltage applied at the voltage source contact is greater than a pinning voltage of the photodetector.

14. The imaging system of claim 13, wherein the voltage source contact is coupled to an independent control line or an independent node.

15. The imaging system of claim 8, wherein the imaging system is at least one selected from the group consisting of an automobile, a vehicle, a camera, a cellular telephone, a tablet computing, a webcam, a video camera, a video surveillance system, and a video gaming system.

* * * * *